United States Patent [19]

Giepen et al.

[11] 4,374,380
[45] Feb. 15, 1983

[54] AUTOMOTIVE ELECTRICAL NETWORK VOLTAGE REGULATION MONITORING CIRCUIT

[75] Inventors: Ulrich Giepen, Mundelsheim; Friedhelm Meyer, Illingen, both of Fed. Rep. of Germany

[73] Assignee: Robert Bosch GmbH, Stuttgart, Fed. Rep. of Germany

[21] Appl. No.: 100,209

[22] Filed: Dec. 4, 1979

[30] Foreign Application Priority Data

Jan. 27, 1979 [DE] Fed. Rep. of Germany ....... 2903219

[51] Int. Cl.$^3$ ............................................. G08B 21/00
[52] U.S. Cl. .................................... 340/660; 340/635; 340/645; 340/653; 322/99
[58] Field of Search .................... 340/52 R, 52 F, 635, 340/645, 650, 653, 660; 322/99

[56] References Cited

U.S. PATENT DOCUMENTS 3,964,039 6/1976 Craford et al. ...................... 340/660
4,019,120 4/1977 Fattic ..................................... 322/99
4,186,391 1/1980 Wang et al. .......................... 340/645

Primary Examiner—Alvin H. Waring
Attorney, Agent, or Firm—Frishauf, Holtz, Goodman & Woodward

[57] ABSTRACT

To provide a visible output indication, for example by an indicator light on a controller supervisory panel of the vehicle, of proper functioning of the voltage regulator power transistor, monitoring circuits are provided which sense the electrical condition of current flow through or the voltage condition of the field winding or output bus respectively by including a light emitting diode (LED) in an indicator circuit, for example by connecting it in series to the coupling resistor. In one form, a Zener diode Z (FIG. 1) is connected across the output bus with the LED in series, so that the LED will light if the output bus reaches a voltage which might damage the battery, for example due to short circuit or alloying-through of the output transistor T of the voltage regulator; in another form, an LED which preferably is green, LDg (FIG. 2), is connected across the output transistor, the green LED lighting if the output transistor functions properly, but extinguishing if the output transistor alloys-through; the LED with the Zener diode and the green LED can be provided together to form alternate outputs—green indicating proper operation and red already danger; in another form, an LED, preferably also green (FIG. 3) is connected across the field winding so that, if the output transistor T' should burn through, extinction of the green diode will indicate that the field no longer receives energization. Of course, the usually provided charge control lamp will then also light since the alternator will no longer furnish output, so that the combination of the green LED across the field with the charge control lamp again provides an alternate output indication, the extinction of the particular green LED pinpointing the trouble which caused the charge control lamp to light.

4 Claims, 4 Drawing Figures

AUTOMOTIVE ELECTRICAL NETWORK VOLTAGE REGULATION MONITORING CIRCUIT

The present invention relates to automotive electrical networks, and more particularly to monitoring circuits and display elements to monitor the operation of the voltage regulating equipment therein to prevent damage to the generation and storage apparatus, typically an alternator with associated rectifier apparatus and a battery, usually installed in an automotive vehicle, but equally applicable to self-contained electronic networks of similar type, for instance installed on board a vessel.

BACKGROUND AND PRIOR ART

It is well known to supervise proper function of an alternator and associated rectifier equipment as well as of an associated voltage regulator in various types of networks; when installed in an automotive vehicle—to which reference will be made in the present application—it is usually customary to provide a charge control instrument, typically a charge control lamp, which is connected to the positive supply bus of the on-board network, to which also the positive terminal of the battery is connected, and further to a junction which is formed by the voltage regulator input. This junction is usually also connected to exciter diodes which form part of the d-c output of the alternator. The charge control lamp will light if the voltage difference between the positive bus and the other terminal of the lamp exceeds a predetermined level. If the prime mover driving the alternator—typically an automotive engine—is stopped, and the main switch, for example the ignition switch, is closed, the positive terminal of the battery is connected to one terminal of the charge control lamp. Current flow will then occur from the positive main bus of the vehicle to ground or chassis. The charge control lamp can be replaced by a moving pointer indicator of the volt meter type.

It is also known to connect an ammeter between the positive terminal of the battery and the positive bus of the vehicle. Usually, the starter terminal is bypassed. If the alternator or generator output is insufficient, or the alternator is defective, or the voltage regulator is defective, the current flowing through the ammeter will be excessive, thus providing a malfunction indication to the operator.

The charge control lamp cannot determine defects which can arise within the voltage regulator itself, for example short circuit of the main power transistor thereof which would cause substantial rise in the voltage of the network, resulting in damage to the battery. The charge control lamp itself, for lighting, requires certain voltage differences and current supply thereto adequate to cause the filament to light. Low output of the alternator, for example due to malfunction of the rectifier diodes, can hardly be recognized by the charge control lamp.

THE INVENTION

It is an object to provide a monitoring or supervisory circuit for combination with a self-contained power network of the automotive type in which malfunction of the voltage regulator and defects not ordinarily recognized by a charge control lamp can be indicated to an operator.

Briefly, light emitting diodes (LED's) are provided connected, for example, in parallel to the output stage, typically the output transistor of a transistorized voltage regulator. The LED is connected through a resistor across the emittter-collector path of the voltage regulator transistor and provides for continuous output thereof, for example lighting green, indicating proper operation. Extinction of the diode indicates malfunction of the regulator by short circuit, that is, alloying through, of the output transistor. Another monitoring indicator is a further LED connected in parallel with the field winding of the alternator which likewise is continuously lit and therefore preferably green and which, upon extinction, provides a warning indication that the output transistor is burned out, that is, forms an open circuit. Indication of excessive voltage rise, which may occur, for example, also upon failure of the output power transistor by short circuit, that is, by alloying through, can be obtained by connecting an LED in series with a Zener diode between the positive or B+ terminal of the system. Preferably, this LED provides a red indication, that is, a warning output, that the on-board voltage of the network has risen above a level which is safe for the battery.

Preferably, the respective LED's are used together; the red-green indication showing short circuit of the voltage regulator output stage is particularly suitable to provide alternative indication.

The arrangement has the advantage that the optical indication is provided by LED's, which can readily be provided in different colors, and which respectively indicate proper operation or malfunction of the voltage regulator. The response time of the LED is short, the structure itself is sturdy and inexpensive and permits miniaturization and location in a very small monitoring array. The lifetime of the elements themselves is high, and the current use in operation is minimal. Burn-out or alloying-through, indicative of short circuit, of the voltage regulator, typically a semiconductor voltage regulator, can be supervised by combination of respective LED's.

DRAWINGS

Figure 4:
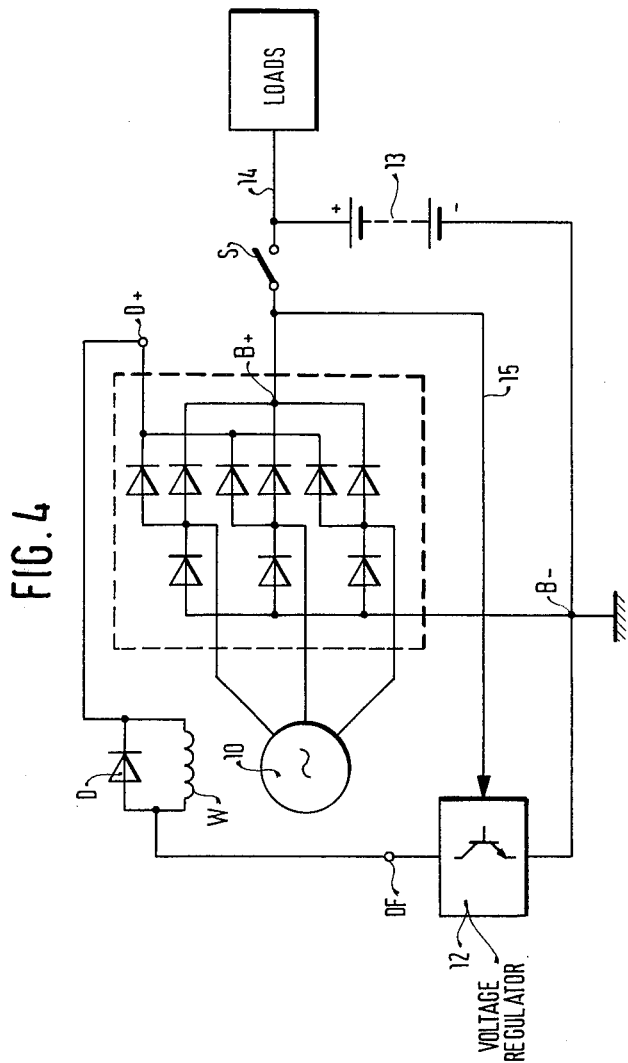
FIG. 4 is a highly schematic diagram of an on-board self-contained vehicular network with which the respective circuits of FIGS. 1–3 can be used, and illustrating the placement of the voltage regulator in the system.

Referring first to FIG. 4: A three-phase alternator 10 has its phase output terminals connected to a 6-diode power rectifier array, the output terminals of which provide the output power terminals of the alternator-diode combination B+ and B−. Additionally, three exciter diodes are provided, usually of substantially lesser power handling capabilities than the main power rectifier diodes, and therefore shown much smaller, and providing a common output terminal D+. The D+ terminal is connected to one terminal of the field winding W. The field winding W is bypassed by a freewheeling diode D. The terminal of the field winding W remote from terminal D+ is connected to the voltage regulator 12. The common field-voltage regulator terminal has the notation DF. The other terminal of the voltage regulator is connected to ground or chassis, that is, to terminal B−. The output terminal B+ of the alternator is connected through a main switch S to the positive terminal of the battery 13. The positive bus of the vehicle network 14 is connected to loads through respective selector switches. Line 15 transmits voltage data.

Figure 1:
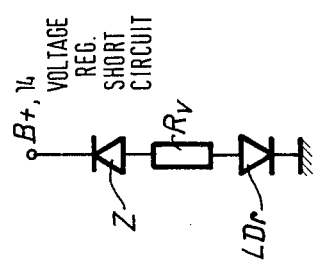
FIG. 1 is a circuit indicating proper voltage level within a predetermined limit of a self-contained on-board electrical network which, for example, is caused by alloying-through or short circuit of the power output stage of a voltage regulator.

The voltage regulator 12 operates in well known manner; when the voltage at the terminal B+ rises above a predetermined reference value, for example as determined by a Zener diode within the voltage regulator, a power transistor T within the voltage regulator is controlled to assume a high resistance value, thus cutting current through the field W; as the voltage drops, the transistor becomes conductive and more power will be available to energize the field W. If the power transistor T should short-circuit, for example by alloying-through, current will be continuously supplied to the field winding W, causing rise in the output voltage at terminal B+. The alloyed-through power transistor T, of course, can no longer be controlled to assume a high resistance value, or even to cut off, and thus the output voltage at terminal B+, and hence across battery 13, will rise. The output transistor T is shown as a simple transistor in FIGS. 2, 3 and 4; it may, and usually will, be a Darlington transistor unit. In effect, upon alloying-through of the output stage transistor T, a low resistance connection between the voltage regulator input DF and ground or chassis B− will be continuously established, thus resulting in over-excitation of the alternator 10. If the circuit of FIG. 1 is connected between the terminals B+ and B−, Zener diode Z (FIG. 1) in series with a dropping resistor Rv and an LED LDr will be energized, that is, Zener diode Z will break down upon sensing excess voltage and causing the LED to light. The subscript r of the LDr is to indicate that the LED preferably has a red light output. Usual automotive batteries of nominally 12 V can tolerate some over-voltage; a suitable breakdown voltage for the Zener diode Z is 15.5 V, indicating an output voltage on the vehicle network which may lead to damage to the battery 13 and possibly other associated equipment connected to bus 14.

Figure 2:
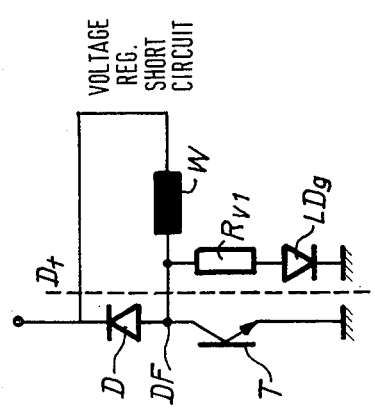
FIG. 2 is another circuit to provide an output indication of proper function or short circuit of an output stage or output transistor of a voltage regulator.

Embodiment of FIG. 2: The output power transistor T of the voltage regulator 12 has its collector connected to the voltage regulator terminal DF and the emitter to ground or chassis. The field winding W of the alternator 10 is likewise connected to terminal DF, the other terminal of which is connected to the exciter diode terminal D+. This connection is standard, the current flow through the field winding W being determined by the conductivity of the transistor T. The freewheeling diode D permits continued current flow, due to the inductance of the field winding W if the transistor cuts off.

In normal operation of the transistor T, the emitter-collector path thereof will have a voltage drop occur thereacross even if the current flowing through the winding W is a maximum, that is, the internal resistance of the transistor T is a minimum. This voltage drop is used in the circuit of FIG. 2 to provide a monitoring indication of operability of the transistor T. An LED with green light output, LDg, is connected over a dropping resistor Rv1 across the transistor T, that is, between the terminal DF and ground or chassis. Under normal operation, that is, when the transistor T is more or less conductive, the diode LDg is continuously operating. Since normal operation is best indicated by a green light, the diode LDg provides a green output, as indicated by the subscript g. Upon short circuit of the transistor T, the voltage drop across the terminals DF and ground or chassis will be insufficient to excite the diode LDg, extinction of the green light therefrom being a signal to the operator of the vehicle that the transistor T no longer provides regulating function.

The circuit of FIG. 2 provides a direct output signal if the transistor T is short-circuited or alloyed-through. The circuit of FIG. 3 provides a direct output signal if the transistor T should burn out, that is, provide an open circuit.

Figure 3:
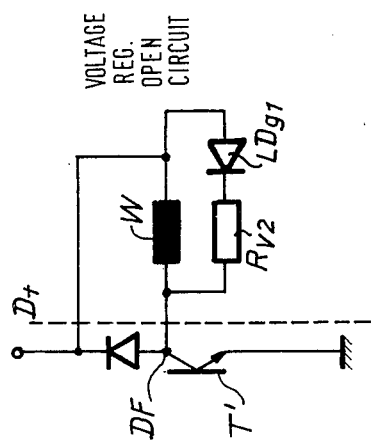
FIG. 3 is a circuit indicating open circuit condition of the output stage of a voltage regulator.

Embodiment of FIG. 3: An LED LDg1, with a series dropping resistor Rv2 is connected in shunt, that is, across the field winding W. The diode LDg1 also, preferably, provides a green light output. Upon proper operation of the transistor T, and consequent proper current flow through the winding W, the LED LDg1 will provide a continuous green light output. An extended period of failure to obtain this green light from the diode indicates that the Darlington output transistor stage T' of the regulator is interrupted, that is, the transistor has an open circuit. Under such conditions, there will be no current flow through the winding W from the exciter terminal D+ through the voltage regulator and to chassis, and thus the diode LDg1 will remain dark, providing a signal indicative of an open circuit condition in the voltage regulator output stage.

In a particularly preferred example, the circuits of FIGS. 1 and 3 are combined, that is, the LED's LDr and LDg1 are placed adjacent each other in a monitoring array. A continuous green light will indicate proper operation of the circuit, that is, current flow through the winding W. Should the transistor T' short-circuit or alloy-through, the green light from diode LDg1 will continue to provide an output but, shortly, the voltage in the on-board network will rise and an additional red warning will be obtained from the diode LDr. An open circuit of the output transistor T' (FIG. 3) will be indicated by total failure of any output from the monitoring array.

Various changes and modifications may be made, and features described in connection with any one of the embodiments may be used with any of the others, within the scope of the inventive concept. The circuits of FIGS. 1, 2 and 3 can all be suitably combined, particularly since the LED's are small, to provide an overall monitoring indicator, for example by placing the diode LDg and LDg1 on either side of the diode LDr. Proper operation would be indicated by continuous lighting of both green diodes; any failure would result in extinction of one of them and, if the on-board network voltage rises above the predetermined level determined by the Zener diode Z, an additional red output of potential substantial damage to the electrical loads connected to line 14 and to the battery 13 will be provided.

Rather than providing green light emitting diodes LDg, LDg1, it is of course also possible to include an inverter stage comprising a transistor having its base-emitter path connected in lieu of the respective diode LDg and LDg1, with the collector thereof connected through a dropping resistor to a red light emitting diode and to either of the terminals D+ or B+. Such a circuit, in normal operation, will cause this inverter transistor to be in blocked condition if current flow through the field winding W is normal. Upon failure of a voltage at the terminal DF, however, either due to alloying-through of the transistor T or open circuiting of the transistor T'. The inverter transistor will be controlled to become conductive, thus providing current through the LED connected in the collector circuit. In this case, the LED connected in the collector circuit should emit red light, indicating malfunction of the output power transistor and the voltage regulator, respectively indicating a short circuit or an open circuit thereof. In due course, after the short circuit, the on-board network voltage across the battery 13 and between the bus 14 and the ground or chassis connection will rise and the diode LDr will also light. Thus, the operator of the vehicle will be warned immediately upon occurrence of the malfunction, and additionally when network conditions have reached critical levels. Combination of such an inverter transistor, together with the necessary dropping resistance network, physically with the LED, is readily possible with current technology and at low additional cost.

Basically, thus, the invention provides a monitoring circuit which supervises the proper operation of the voltage regulator power semiconductor T, T' by sensing the electrical condition of the filed winding—that is, voltage thereacross or voltage of the field winding with respect to ground or chassis and forming a reference so that, thereby, the open circuit or short-circuit condition of the power semiconductor T, T' is determined. Should the power semiconductor be open, no current will flow through the field winding, thus pinpointing trouble which, otherwise, would also be indicated by the charge control lamp which is usually provided; or, should the power semiconductor be alloyed-through, that is, short-circuited, excessive voltage rise and/or the voltage drop normally across a properly operating power semiconductor T, T' will be displayed.

We claim:
1. In an automotive-type self-contained on-board vehicular electrical network having a storage battery (13);
 a generator (10) having a field winding (W) and supplying d-c output at a terminal (B+) for supply of power to a load bus (14) to charge the storage battery connected to the terminal (B+);
 and a voltage regulator (12) having a power semiconductor (T, T') connected to the output (D+) of the generator and controlling power flow to the field winding (W) and having means (15) responsive to the voltage level on the power bus of the system controlling conduction of said power semiconductor in cycles to maintain an average predetermined current flow through the field winding in accordance with power requirements placed on the load bus,
and comprising,
a monitoring circuit to supervise proper operation of the voltage regulator power semiconductor (T, T') comprising
means sensing the electrical condition of the field winding (W) and including a light-emitting diode (LED), (LDr, LDg, LDg1) which, upon change of its illumination state, provides an output indication of the relation of the field winding with respect to the voltage thereacross, or with respect to a reference level;

wherein (FIG. 1) the electrical condition is the voltage across the load bus (14) and the sensing means comprises
 a Zener diode (Z) in series with said LED (LDr) connected across the load bus, said Zener diode breaking down and thus causing the LED to light when the voltage on the bus (14) exceeds a predetermined level due to short circuit of the voltage regulator semiconductor (T) and hence uncontrolled current flow through the field winding (W).
2. In an automotive-type self-contained on-board vehicular electrical network having a storage battery (13);
 a generator (10) having a field winding (W) and supplying d-c output at a terminal (B+) for supply of power to a load bus (14) to charge the storage battery connected to the terminal (B+);
 and a voltage regulator (12) having a power semiconductor (T, T') connected to the output (D+) of the generator and controlling power flow to the field winding (W) and having means (15) responsive to the voltage level on the power bus of the system controlling conduction of said power semiconductor in cycles to maintain an average predetermined current flow through the field winding in accordance with power requirements placed on the load bus,
and comprising,
a monitoring circuit to supervise proper operation of the voltage regulator power semiconductor (T, T') comprising
means sensing the electrical condition of the field winding (W) and including a light-emitting diode (LED) (LDr, LDg, LDg1) which, upon change of its illumination state, provides an output indication of the relation of the field winding with respect to the voltage thereacross, or with respect to a reference level, the electrical condition is current flow through the field winding (W) and the sensing means comprises a circuit element (Rv1) connecting the LED (LDg) in shunt across the power current path of the voltage regulator power semiconductor (T), the voltage drop across the power semiconductor (T) normally providing operating voltage to said LED to cause said LED to light when the power semiconductor is operating normally, said voltage being insufficient to maintain the LED in illuminated state upon alloying-through or short circuit of the power semiconductor and hence uncontrolled current flow through the field winding (W).
3. In an automotive-type self-contained on-board vehicular electrical network having a storage battery (13);
 a generator (10) having a field winding (W) and supplying d-c output at a terminal (B+) for supply of power to a load bus (14) to charge the storage battery connected to the terminal (B+);
 and a voltage regulator (12) having a power semiconductor (T, T') connected to the output (D+) of the generator and controlling power flow to the field winding (W) and having means (15) responsive to the voltage level on the power bus of the system controlling conduction of said power semiconductor in cycles to maintain an average predetermined current flow through the field winding in accordance with power requirements placed on the load bus, and comprising,
a monitoring circuit to supervise proper operation of the voltage regulator power semiconductor (T, T') comprising
means sensing the electrical condition of the field winding (W) and including a light-emitting diode (LED) (LDr, LDg, LDg1) which, upon change of its illumination state, provides an output indication of the relation of the field winding with respect to the voltage thereacross, or with respect to a reference level
   wherein (FIG. the electrical condition is voltage across the field winding (W), and the sensing means comprises a circuit element (Rv2) connecting the LED across the field winding, said LED being in illuminated state under normal operating conditions due to the voltage drop across the field winding, and indicating, by changing to extinguished state burn-out or open circuit condition of the power semiconductor (T'), thus interrupting a closed circuit to the field winding and isolating the field winding from current flow therethrough.

4. Monitoring circuit according to claim 1, further including an additional sensing means and an additional LED, said additional sensing means and LED comprising a circuit element (Rv1) and said additional LED, connected across the main power path of the voltage regulator power semiconductor (T), the voltage drop across said main power semiconductor providing operating voltage to said LED under normal operating conditions and then maintaining said additional LED in illuminated state, said additional LED extinguishing upon alloying-through or short circuit of said power semiconductor, resulting in uncontrolled current flow through the field winding (W) which, when continued, will cause the voltage across said load bus (14) to rise and change of the LED connected to the Zener diode to change to illuminated state to provide alternate "good" and "faulty" operating indication.

* * * * *